(12) United States Patent
Shi et al.

(10) Patent No.: US 11,742,139 B2
(45) Date of Patent: Aug. 29, 2023

(54) CURRENT TRANSFORMER

(71) Applicant: HUAWEI TECHNOLOGIES CO., LTD., Guangdong (CN)

(72) Inventors: Lei Shi, Shanghai (CN); Mingyu Xue, Shenzhen (CN); Fei Ye, Shenzhen (CN); Jun Zhang, Shenzhen (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 382 days.

(21) Appl. No.: 16/881,366

(22) Filed: May 22, 2020

(65) Prior Publication Data
US 2020/0286681 A1 Sep. 10, 2020

Related U.S. Application Data

(63) Continuation of application No. PCT/CN2018/115588, filed on Nov. 15, 2018.

(30) Foreign Application Priority Data

Nov. 25, 2017 (CN) .................... CN201711196326.6

(51) Int. Cl.
H01F 38/30 (2006.01)
H01F 27/24 (2006.01)
H01F 27/28 (2006.01)

(52) U.S. Cl.
CPC ............. *H01F 38/30* (2013.01); *H01F 27/24* (2013.01); *H01F 27/28* (2013.01)

(58) Field of Classification Search
CPC .......... H01F 38/30; H01F 27/24; H01F 27/28; H01F 27/306; H01F 27/2823;
(Continued)

(56) References Cited

U.S. PATENT DOCUMENTS 2,802,981 A * 8/1957 Blankenbuehler .... H01F 38/085
323/250
5,793,196 A 8/1998 White
(Continued)

FOREIGN PATENT DOCUMENTS

CN 101197205 A 6/2008
CN 101552116 A * 10/2009
(Continued)

OTHER PUBLICATIONS

Tleis, Power Systems Modelling and Fault Analysis, 2008, pp. 1-5 (Year: 2008).*
(Continued)

*Primary Examiner* — Jared Fureman
*Assistant Examiner* — Michael J Warmflash
(74) *Attorney, Agent, or Firm* — WOMBLE BOND DICKINSON (US) LLP

(57) ABSTRACT

A current transformer (10) includes a magnetic core, a first primary-side winding, a second primary-side winding, and a first secondary-side winding. The magnetic core includes a first magnetic core structure, a second magnetic core structure, and a third magnetic core structure. The first magnetic core structure is connected to the second magnetic core structure to constitute a first closed magnetic circuit, the first magnetic core structure is connected to the third magnetic core structure to constitute a second closed magnetic circuit, and the first magnetic core structure is a magnetic core structure common to the first closed magnetic circuit and the second closed magnetic circuit.

12 Claims, 6 Drawing Sheets

(58) Field of Classification Search
CPC ........... H01F 2038/305; H01F 27/2895; Y02E 10/50; G01R 15/183
See application file for complete search history.

(56) References Cited

U.S. PATENT DOCUMENTS

| | | | |
|---|---|---|---|
| 6,683,766 B1 | 1/2004 | Guo et al. | |
| 2015/0170822 A1* | 6/2015 | Ye | H01F 38/023 336/12 |
| 2016/0254756 A1* | 9/2016 | Yang | H01F 27/2823 363/21.02 |
| 2016/0307683 A1* | 10/2016 | Davis | E05B 47/02 |

FOREIGN PATENT DOCUMENTS

| | | | |
|---|---|---|---|
| CN | 101552116 A | | 10/2009 |
| CN | 201444443 U | | 4/2010 |
| CN | 201444443 U | * | 4/2010 |
| CN | 102074330 A | | 5/2011 |
| CN | 102394168 A | | 3/2012 |
| CN | 102709042 A | | 10/2012 |
| CN | 103871716 A | | 6/2014 |
| CN | 204464038 U | | 7/2015 |
| CN | 205303103 U | | 6/2016 |
| CN | 107370123 A | | 11/2017 |
| CN | 108039267 A | | 5/2018 |
| CN | 109802441 A | | 5/2019 |
| JP | 2000500929 A | | 1/2000 |
| JP | 2009295839 A | | 12/2009 |
| LT | 6025 B | * | 5/2014 |

OTHER PUBLICATIONS

Circuit Globe, Magnetic reluctance, Oct. 2017, pp. 1-8 (Year: 2017).*

Shen Wentao:"Research on Power Quality Problem of Grid-Connected Photovoltaic Generation System", 2012. School of Electrical and Electronic Engineering, Mar. 2012. total 60 pages. With English abstract.

Xiu Yao et al. Characteristic Study and Time-Domain Discrete-Wavelet-Transform Based Hybrid Detection of Series DC Arc Faults, IEEE Transactions On Power Electronics, vol. 29, No. 6, Jun. 2014, pp. 3103-3115.

* cited by examiner

CURRENT TRANSFORMER

CROSS-REFERENCE TO RELATED APPLICATIONS

This application is a continuation of International Application No. PCT/CN2018/115588, filed on Nov. 15, 2018, which claims priority to Chinese Patent Application No. 201711196326.6, filed on Nov. 25, 2017. The disclosures of the aforementioned applications are hereby incorporated by reference in their entireties.

TECHNICAL FIELD

This application relates to an electronic element, and in particular, to a current transformer.

BACKGROUND

A photovoltaic power generation system is a power generating system that directly converts solar energy into electric energy by using a solar cell. Direct current arcing may occur in a process of generating power by using the photovoltaic power generation system. Usually, an arcing detection apparatus (AFCI) is used to identify whether there is direct current arcing in the photovoltaic power generation system. To eliminate the risk, the AFCI needs to accurately capture a differential-mode-current noise signal generated in an arcing process.

In a circuit, a primary-side winding of a current transformer is serially connected to a power line on which a current needs to be measured, and a current that flows through the primary-side winding may be determined based on a detected current that flows through a secondary-side winding of the current transformer, and further the current that needs to be measured is determined. The current transformer may be configured to detect a differential mode current and a common mode current in the power line. However, in an actual circuit, there are both the differential mode current and the common mode current in the power line. Because the differential mode current and the common mode current flow through the same line, the common mode current affects the differential mode current output from the current transformer. It is difficult to independently measure the differential mode current, and a captured differential mode current is not accurate enough.

SUMMARY

This application provides a current transformer with a simple structure, so that a differential-mode-current signal and a common-mode-current signal can be accurately collected, to independently measure a differential mode current and a common mode current.

According to a first aspect, an embodiment of this application provides a current transformer applicable to an arcing detection apparatus. The current transformer is configured to detect a differential-mode-current signal. The current transformer includes a magnetic core, a first primary-side winding, a second primary-side winding, and a first secondary-side winding. The magnetic core includes a first closed magnetic circuit and a second closed magnetic circuit. The first closed magnetic circuit is formed by connecting a first magnetic core structure and a second magnetic core structure, the second closed magnetic circuit is formed by connecting the first magnetic core structure and a third magnetic core structure, and the first magnetic core structure is a magnetic core structure common to the first closed magnetic circuit and the second closed magnetic circuit. The first primary-side winding passes through the first closed magnetic circuit, and the second primary-side winding passes through the second closed magnetic circuit. The first secondary-side winding is wound around the first magnetic core structure.

When the current transformer is connected to a circuit to detect a differential mode current in the circuit, if a first current that flows through the first primary-side winding and a second current that flows through the second primary-side winding are differential mode currents, a first magnetic flux and a second magnetic flux are superimposed; or if the first current that flows through the first primary-side winding and the second current that flows through the second primary-side winding are common mode currents, the first magnetic flux and the second magnetic flux cancel each other out. The first magnetic flux is a magnetic flux that is generated in the first magnetic core structure when the first current passes through the first primary-side winding, and the second magnetic flux is a magnetic flux that is generated in the first magnetic core structure when the second current passes through the second primary-side winding.

In one embodiment, the first primary-side winding and the second primary-side winding may be respectively serially connected to two lines on which the differential mode currents need to be measured. When the first current that flows through the first primary-side winding and the second current that flows through the second primary-side winding are differential mode currents, a positive direction of the first magnetic flux generated by the first current in the first magnetic core structure is the same as a positive direction of the second magnetic flux generated by the second current in the first magnetic core structure, and the first magnetic flux and the second magnetic flux are superimposed, to increase magnetic fluxes generated by the differential mode currents. When the first current that flows through the first primary-side winding and the second current that flows through the second primary-side winding are the common mode currents, a positive direction of the first magnetic flux generated by the first current in the first magnetic core structure is opposite to a positive direction of the second magnetic flux generated by the second current in the first magnetic core structure, and the first magnetic flux and the second magnetic flux cancel each other out, to suppress magnetic fluxes generated by the common mode currents. Because the magnetic fluxes generated by the common mode currents are suppressed, magnetic fluxes in the first magnetic core structure are mainly the magnetic fluxes generated by the differential mode currents. A change of a magnetic flux in the first magnetic core structure enables the first secondary-side winding wound around the first magnetic core structure to generate an induced current. Therefore, a current output by the first secondary-side winding may be used to feed back the differential mode current.

In some possible embodiments, the second magnetic core structure may be a "U"-shaped magnetic core structure, an arc-shaped magnetic core structure, an angle-shaped magnetic core structure, or the like. The third magnetic core structure may be a "U"-shaped magnetic core structure, an arc-shaped magnetic core structure, an angle-shaped magnetic core structure, or the like. A shape and a size of the second magnetic core structure and a shape and a size of the third magnetic core structure are not limited in this application.

In one embodiment, the second magnetic core structure and the third magnetic core structure are magnetic core structures symmetric to each other, and the second magnetic core structure and the third magnetic core structure have a same size and a same shape.

In a possible implementation, the second magnetic core structure and the third magnetic core structure have a same magnetic resistance, and both the second magnetic core structure and the third magnetic core structure have a comparatively small magnetic resistance.

In one embodiment, the current transformer may further include a second secondary-side winding. A first winding of the second secondary-side winding is wound around the second magnetic core structure, and a second winding of the second secondary-side winding is wound around the third magnetic core structure. The first winding of the second secondary-side winding and the second winding of the second secondary-side winding are serially connected.

When the first current that flows through the first primary-side winding and the second current that flows through the second primary-side winding are differential mode currents, a positive direction of a third magnetic flux generated by the first current in the second magnetic core structure and the third magnetic core structure is opposite to a positive direction of a fourth magnetic flux generated by the second current in the second magnetic core structure and the third magnetic core structure, and the third magnetic flux and the fourth magnetic flux cancel each other out, to suppress the magnetic fluxes generated by the differential mode currents. When the first current that flows through the first primary-side winding and the second current that flows through the second primary-side winding are common mode currents, a positive direction of a third magnetic flux generated by the first current in the second magnetic core structure and the third magnetic core structure is the same as a positive direction of a fourth magnetic flux generated by the second current in the second magnetic core structure and the third magnetic core structure, and the third magnetic flux and the fourth magnetic flux are superimposed, to increase the magnetic fluxes generated by the common mode currents. Therefore, a current output by the second secondary-side winding may be used to feed back the common mode current. That is, the differential mode current and the common mode current may be independently measured by using the first secondary-side winding and the second secondary-side winding.

According to a second aspect, an embodiment of this application provides another current transformer applicable to an apparatus that needs to detect a common mode current. The current transformer is configured to detect the common mode current. The current transformer includes a first primary-side winding, a second primary-side winding, and a second secondary-side winding. A magnetic core includes a first closed magnetic circuit and a second closed magnetic circuit. The first closed magnetic circuit is formed by connecting a first magnetic core structure and a second magnetic core structure, the second closed magnetic circuit is formed by connecting the first magnetic core structure and a third magnetic core structure, and the first magnetic core structure is a magnetic core structure common to the first closed magnetic circuit and the second closed magnetic circuit. The first primary-side winding passes through the first closed magnetic circuit, and the second primary-side winding passes through the second closed magnetic circuit. A first winding of the second secondary-side winding is wound around the second magnetic core structure, a second winding of the second secondary-side winding is wound around the third magnetic core structure, and the first winding of the second secondary-side winding and the second winding of the second secondary-side winding are serially connected.

When the current transformer is connected to a circuit to detect the common mode current in the circuit, if a first current that flows through the first primary-side winding and a second current that flows through the second primary-side winding are differential mode currents, a third magnetic flux and a fourth magnetic flux are superimposed; or if the first current that flows through the first primary-side winding and the second current that flows through the second primary-side winding are common mode currents, the third magnetic flux and the fourth magnetic flux cancel each other out. The third magnetic flux is a magnetic flux that is generated in the second magnetic core structure and the third magnetic core structure when the first current passes through the first primary-side winding, and the fourth magnetic flux is a magnetic flux that is generated in the second magnetic core structure and the third magnetic core structure when the second current passes through the second primary-side winding.

In one embodiment, the first primary-side winding and the second primary-side winding may be respectively serially connected to two lines on which the common mode currents need to be measured. When the first current that flows through the first primary-side winding and the second current that flows through the second primary-side winding are the differential mode currents, a positive direction of the third magnetic flux generated by the first current in the second magnetic core structure and the third magnetic core structure is opposite to a positive direction of the fourth magnetic flux generated by the second current in the second magnetic core structure and the third magnetic core structure, and the third magnetic flux and the fourth magnetic flux cancel each other out, to suppress the magnetic fluxes generated by the differential mode currents. When the first current that flows through the first primary-side winding and the second current that flows through the second primary-side winding are the common mode currents, the positive direction of the third magnetic flux generated by the first current in the second magnetic core structure and the third magnetic core structure is the same as a positive direction of a magnetic flux generated by the second current in the second magnetic core structure and the third magnetic core structure, and the third magnetic flux and the fourth magnetic flux are superimposed. For currents that pass through the two power lines, one current may be a sum of common mode currents with a same value, and the other current may be a difference between differential mode currents with a same value. Because magnetic fluxes generated by the differential mode current are suppressed, a magnetic flux in the second magnetic core structure and a magnetic flux in the third magnetic core structure are mainly magnetic fluxes generated by the common mode currents. A change of the magnetic flux in the second magnetic core structure enables the first winding of the second secondary-side winding wound around the second magnetic core structure to generate an induced current, and a change of the magnetic flux in the third magnetic core structure enables the second winding of the second secondary-side winding wound around the third magnetic core structure to generate the induced current. Therefore, a current output by the second secondary-side winding may be used to feed back the common mode current.

In some possible embodiments, the second magnetic core structure may be a "U"-shaped magnetic core structure, an arc-shaped magnetic core structure, an angle-shaped magnetic core structure, or the like. The third magnetic core structure may be a "U"-shaped magnetic core structure, an arc-shaped magnetic core structure, an angle-shaped magnetic core structure, or the like. A shape and a size of the second magnetic core structure and a shape and a size of the third magnetic core structure are not limited in this application.

In one embodiment, the second magnetic core structure and the third magnetic core structure are magnetic core structures symmetric to each other, and the second magnetic core structure and the third magnetic core structure have a same size and a same shape.

In one embodiment, the second magnetic core structure and the third magnetic core structure have a same magnetic resistance, and both the second magnetic core structure and the third magnetic core structure have a comparatively small magnetic resistance.

BRIEF DESCRIPTION OF DRAWINGS

To describe technical solutions in the embodiments of this application more clearly, the following describes the accompanying drawings required for the embodiments in this application.

DESCRIPTION OF EMBODIMENTS

The following describes technical solutions in the embodiments of this application with reference to the accompanying drawings in the embodiments of this application.

Figure 1:
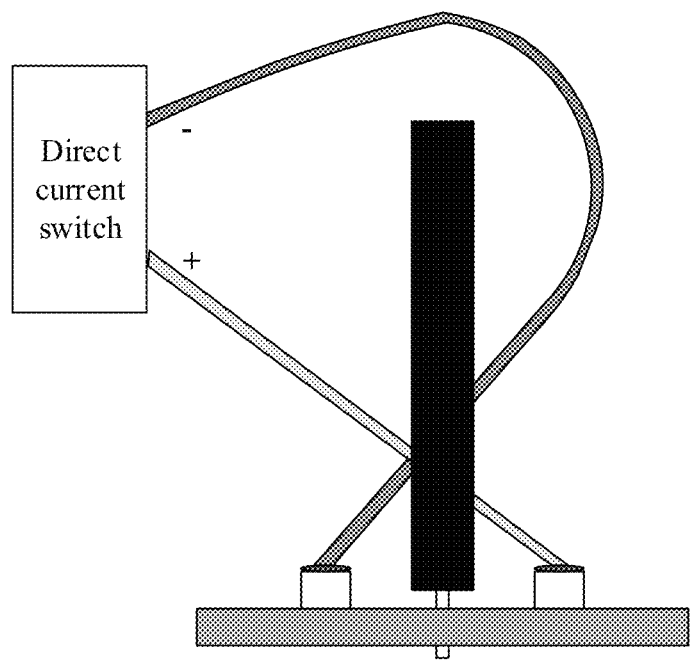
FIG. 1 and FIG. 2 show some prior-art solutions of current transformers.
Figure 2:
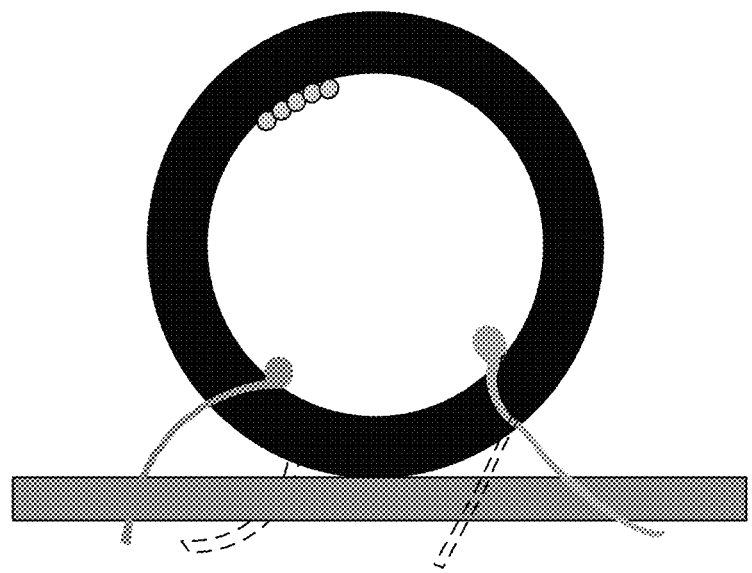

In some current solutions, to independently measure a differential mode current, one positive primary-side winding and one negative primary-side winding are usually disposed in a current transformer to suppress a common mode current. FIG. 1 and FIG. 2 show some prior-art solutions of current transformers for detecting a differential mode current.

A first solution is shown in FIG. 1. A current transformer includes only a magnetic core and a secondary-side winding. When the current transformer is connected to a circuit, a first cable through which a positive current passes is forward inserted, and a second cable through which a negative current passes is reversely inserted. In this solution, if the first cable and the second cable are wrongly inserted in directions, a differential mode current cannot be independently measured.

A second solution is shown in FIG. 2. A current transformer includes a magnetic ring, a first primary-side winding, a second primary-side winding, and a secondary-side winding. The first primary-side winding, the second primary-side winding, and the secondary-side winding are all wound around the magnetic ring. Lead-out pins of the first primary-side winding are crossed, and lead-out pins of the second primary-side winding are not crossed. In this solution, because the lead-out pins of the first primary-side winding need to be crossed, the first primary-side winding needs to be bent, and this is difficult in processing.

In the solution of this application, a first primary-side winding and a second primary-side winding respectively pass through two different closed magnetic circuits of a magnetic core without bending the primary-side winding, and such a structure is simple. When a current transformer is connected to a circuit, only one lead-out pin of a first primary-side winding and one lead-out pin of a second primary-side winding need to be connected to the circuit, so that a differential mode current can be independently measured without threading.

Figure 3:
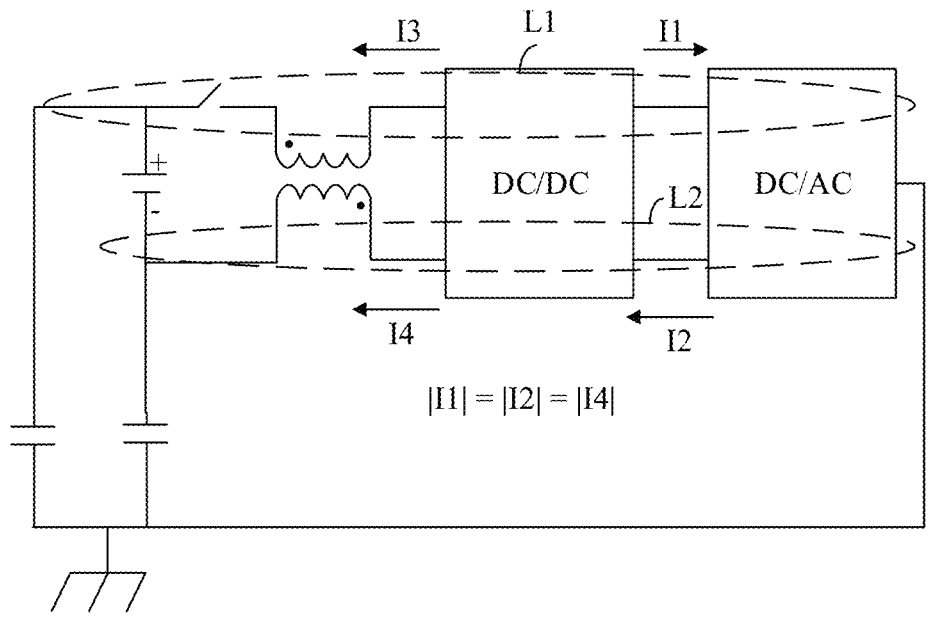
FIG. 3 is a schematic diagram of a circuit formed by connecting two primary-side windings of a current transformer to a circuit according to an embodiment of this application.

The solution in this application may be applied to a circuit in which a differential mode current and/or a common mode current need/needs to be independently detected. For example, the solution may be applied to an arcing detection apparatus. A circuit formed by connecting two primary-side windings of the current transformer in this application to a circuit may be shown in FIG. 3. FIG. 3 is a schematic diagram of the circuit formed by connecting the two primary-side windings of the current transformer to the circuit according to an embodiment of this application. As shown in the diagram, the two primary-side windings of the current transformer are respectively connected to two parallel power lines (L1 and L2). I1 and I2 have a same value but have opposite directions, and I1 and I2 are differential mode currents in the two power lines. I3 and I4 have a same direction, and I3 and I4 are common mode currents in the two power lines. A secondary-side winding of the current transformer in this application is connected to a current detection circuit. One end of the secondary-side winding of the current transformer is grounded, and the other end of the current transformer is connected to a detection apparatus. For example, the other end of the current transformer is connected to a galvanometer, or the secondary-side winding of the current transformer is connected to a pin of a processor, or the like.

Figure 4:
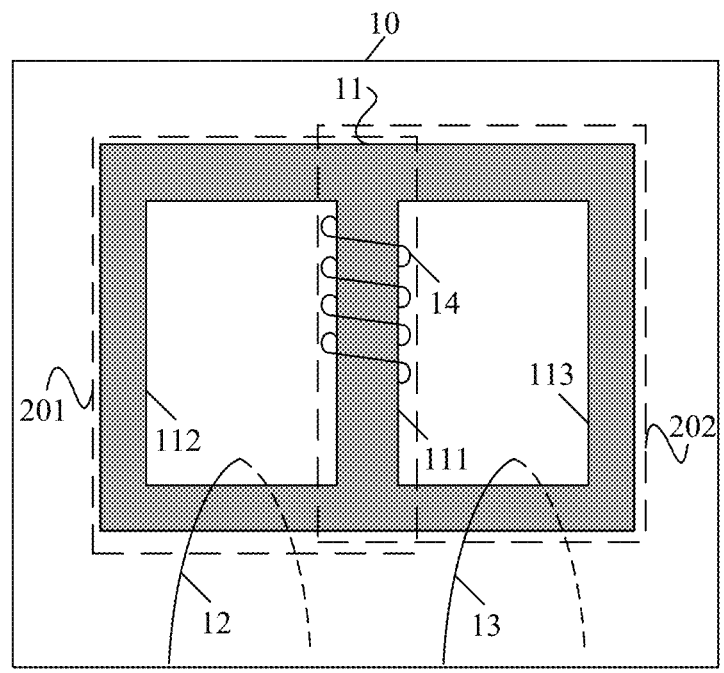
FIG. 4 is a schematic structural diagram of a current transformer according to an embodiment of this application.

FIG. 4 is a schematic structural diagram of a current transformer according to an embodiment of this application. As shown in the diagram, a current transformer 10 includes a magnetic core 11, a first primary-side winding 12, a second primary-side winding 13, and a first secondary-side winding 14.

The magnetic core 11 includes a first closed magnetic circuit 201 and a second closed magnetic circuit 202. The first closed magnetic circuit 201 is formed by connecting a first magnetic core structure 111 and a second magnetic core structure 112, the second closed magnetic circuit 202 is formed by connecting the first magnetic core structure 111 and a third magnetic core structure 113, and the first magnetic core structure 111 is a magnetic core structure common to the first closed magnetic circuit 201 and the second closed magnetic circuit 202. The first primary-side winding 12 passes through the first closed magnetic circuit 201. The second primary-side winding 13 passes through the second closed magnetic circuit 202. The first secondary-side winding 54 is wound around the first magnetic core structure 111.

Figure 5:
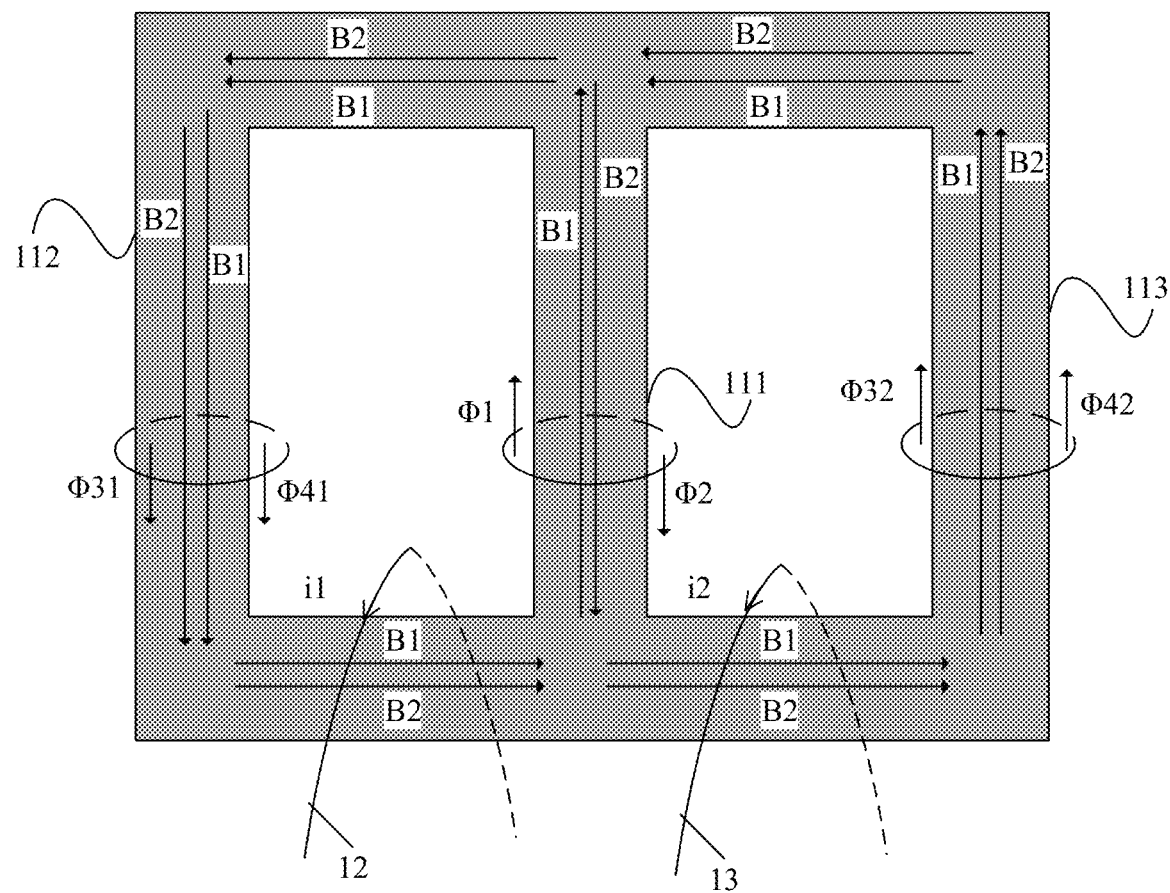
FIG. 5 is a schematic diagram of a direction of a magnetic flux generated in a magnetic core when an electrified current that flows through a first primary-side winding and an electrified current that flows through a second primary-side winding have a same direction.
Figure 6:
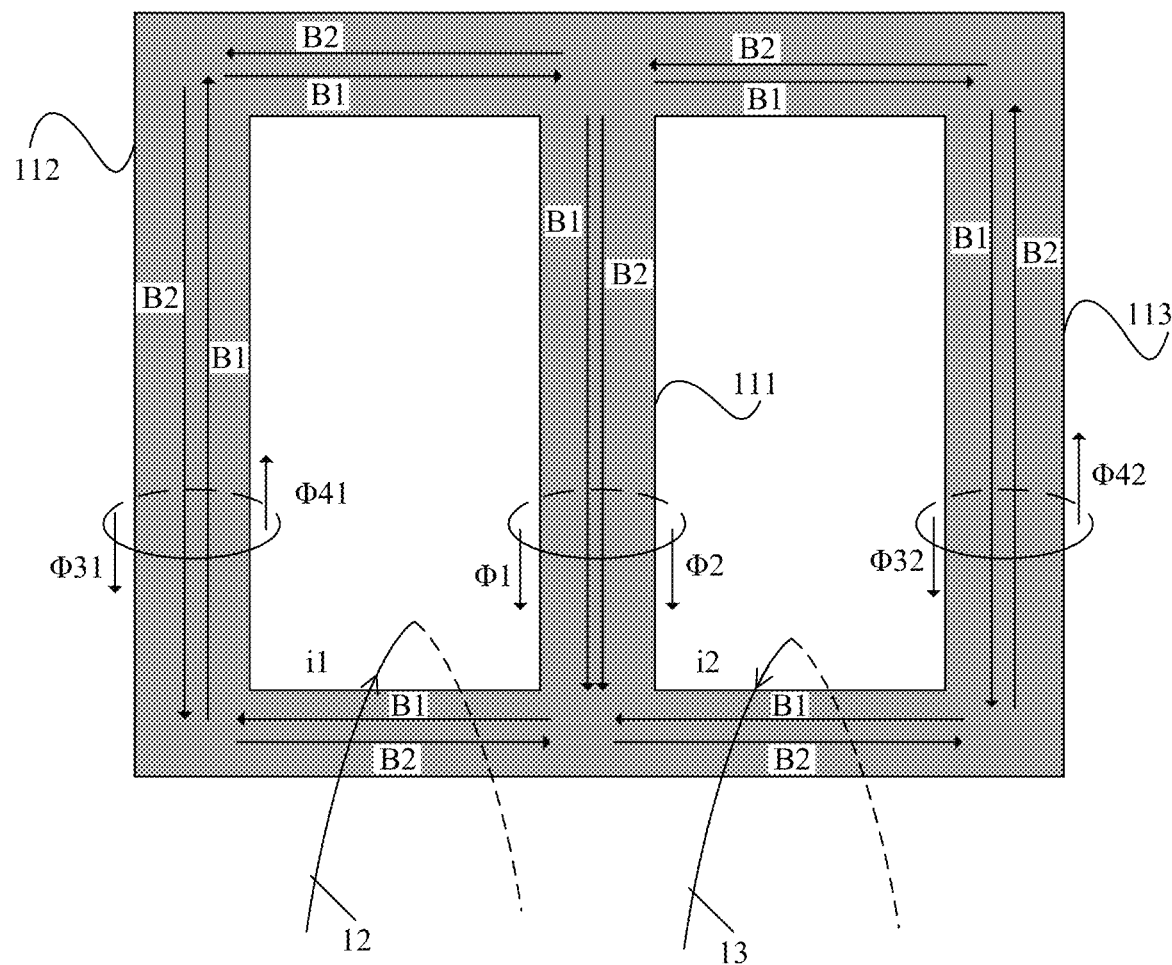
FIG. 6 is a schematic diagram of a direction of a magnetic flux generated in a magnetic core when an electrified current that flows through a first primary-side winding and an electrified current that flows through a second primary-side winding have opposite directions.

When the current transformer 10 is connected to a circuit to detect electrified currents of two parallel power lines (for example, the first power line L1 and the second power line L2 in FIG. 3), for positive directions and negative directions of magnetic fluxes that are generated in the magnetic cores by electrified currents that flow through the first primary-side winding and the second primary-side winding, refer to FIG. 5 and FIG. 6. The magnetic flux is a scalar. In this application, the positive direction and the negative direction of the magnetic flux are related to a magnetic field direction of a magnetic field that passes through a cross section of the magnetic core. The direction of the magnetic field is the positive direction of the magnetic flux.

FIG. 5 is a schematic diagram of a direction of a magnetic flux generated in a magnetic core when an electrified current that flows through a first primary-side winding and an electrified current that flows through a second primary-side winding have a same direction. As shown in FIG. 5, a direction of the electrified current i1 that flows through the first primary-side winding and a direction of the electrified current i2 that flows through the second primary-side winding are both perpendicular to paper outward. The i1 generates a first magnetic field, the i2 generates a second magnetic field, and both the first magnetic field and the second magnetic field have a counter-clockwise direction. When the magnetic field passes through a cross section of a first magnetic core structure, a magnetic field direction of the first magnetic field is upward, and a positive direction of a first magnetic flux Φ1 generated by the i1 in the first magnetic core structure is upward; and a magnetic field direction of the second magnetic field is downward, and a positive direction of a second magnetic flux Φ2 generated by the i2 in the first magnetic core structure is downward.

FIG. 6 is a schematic diagram of a direction of a magnetic flux generated in a magnetic core when an electrified current that flows through a first primary-side winding and an electrified current that flows through a second primary-side winding have opposite directions. As shown in FIG. 6, a direction of an electrified current i1 that flows through the first primary-side winding is perpendicular to paper inward, and a direction of an electrified current i2 that flows through the second primary-side winding is perpendicular to paper outward. The i1 generates a first magnetic field, and the first magnetic field has a clockwise direction. The i2 generates a second magnetic field, and the second magnetic field has a counter-clockwise direction. When the magnetic field passes through a cross section of a first magnetic core structure, a magnetic field direction of the first magnetic field is downward, that is, a positive direction of a first magnetic flux Φ1 generated by the i1 in the first magnetic core structure is downward; and a magnetic field direction of the second magnetic field is downward, that is, a positive direction of a second magnetic flux Φ2 generated by the i2 in the magnetic core structure is downward.

It can be learned from FIG. 5 and FIG. 6 that when the electrified current that flows through the first primary-side winding and the electrified current that flows through the second primary-side winding are currents with a same direction, magnetic fluxes generated by the two electrified currents in the first magnetic core structure have different directions: a position direction and a negative direction, and the magnetic fluxes cancel each other out. When the electrified current that flows through the first primary-side winding and the electrified current that flows through the second primary-side winding are current with different directions, magnetic fluxes generated by the two electrified currents in the first magnetic core structure have a same direction: a positive direction or a negative direction, and the magnetic fluxes are superimposed.

The following uses an example to describe a case in which the magnetic fluxes generated by the electrified currents in the magnetic core are in the first magnetic core structure. It is assumed that the first primary-side winding and the second primary-side winding of the current transformer shown in FIG. 4 are connected to the circuit in FIG. 3. There are the following several cases for a first current I5 that flows through the power line L1 and a second current I5 that flows through the power line L2. In a first case, the I5 and the I6 are currents with a same value but in opposite directions. In a second case, the I5 and the I6 are currents with a same value and in a same direction. In a third case, the I5 and the I6 are currents with different values and in a same direction.

In the first case, it is assumed that both the I5 and the I6 are 2 A, a current direction of the I5 is perpendicular to paper inward, and a current direction of the I6 is perpendicular to paper outward. When the second magnetic core structure and the third magnetic core structure have a same magnetic permeability, a first magnetic flux Φ1 generated by the I5 in the first magnetic core structure is equal to a second magnetic flux Φ2 generated by the I6 in the first magnetic core structure. Because both a positive direction of the first magnetic flux Φ1 and a positive direction of the second magnetic flux Φ2 are downward, a total magnetic flux Φ generated by the I5 and the I6 in the second magnetic core structure is Φ=Φ1+Φ2=2Φ1=2Φ2.

In the second case, it is assumed that both the I5 and the I6 are 2 A, and the current direction of the I5 and the current direction of the I6 are perpendicular to paper outward. When the second magnetic core structure and the third magnetic core structure have a same magnetic permeability, a first magnetic flux Φ1 generated by the Φ5 in the first magnetic core structure is equal to a second magnetic flux I2 generated by the I6 in the first magnetic core structure. Because a positive direction of the first magnetic flux Φ1 is upward, and a positive direction of the second magnetic flux Φ2 is downward, a total magnetic flux Φ generated by the I5 and the I6 in the second magnetic core structure is Φ=Φ1−Φ2=0.

In the third case, it is assumed that the I5 is 3 A, the I6 is 1 A, and the current direction of the I5 and the current direction of the I6 are perpendicular to paper outward. The current I5 may be decomposed into a 2 A-current i51 with a current direction perpendicular to paper outward and a 2 A-current i52 with a current direction perpendicular to paper outward. The current I6 is decomposed into a 2 A-current i61 with a current direction perpendicular to paper outward and a 1 A-current i62 with a current direction perpendicular to paper inward. When the second magnetic core structure and the third magnetic core structure have a same magnetic permeability, a magnetic flux Φ51 generated by the current i51 in the first magnetic core is equal to a magnetic flux Φ61 generated by the current i61 in the first magnetic core. A magnetic flux Φ52 generated by the current i52 in the first magnetic core is equal to a magnetic flux Φ62 generated by the current i62 in the first magnetic core. Because a positive direction of the magnetic flux Φ51 is upward, a positive direction of the magnetic flux Φ61 is downward, a positive direction of the magnetic flux Φ52 is upward, and a positive direction of the flux Φ62 is upward, a total magnetic flux Φ generated by the I5 and the I6 in the second magnetic core structure is Φ=Φ51−Φ61+Φ52+Φ62=2Φ52=2Φ62.

It can be learned from the foregoing that when the first current that flows through the first primary-side winding and the second current that flows through the second primary-side winding are the currents with the same value but in the opposite directions, the magnetic flux generated by the first current in the first magnetic core structure and the magnetic flux generated by the second current in the first magnetic core structure are superimposed. When the first current that flows through the first primary-side winding and the second current that flows through the second primary-side winding are the currents with the same value and in the same direction, the magnetic flux generated by the first current in the second magnetic core structure and the magnetic flux generated by the second current in the second magnetic core structure cancel each other out. When the first current that flows through the first primary-side winding and the second current that flows through the second primary-side winding are currents with different values, the two currents are equal to a group of currents with a same value and in a same direction and a group of currents with different values and in a same direction. Magnetic fluxes generated by the currents with the same value and in the same direction in the first magnetic core structure are superimposed, and magnetic fluxes generated by currents in the first magnetic core structure with different values and in the same direction cancel each other out. In the two parallel power lines, the currents with the same value and in the same direction are the differential mode currents. Therefore, magnetic fluxes in the first magnetic core structure are mainly magnetic fluxes generated by the differential mode currents that pass through the first primary-side winding and the second primary-side winding. An induced current generated by the first secondary-side winding wound around the first magnetic core structure is an induced current corresponding to the differential mode current. That is, a current detected by the first secondary-side winding is a differential mode current, so that the differential mode current is independently measured.

Figure 7:
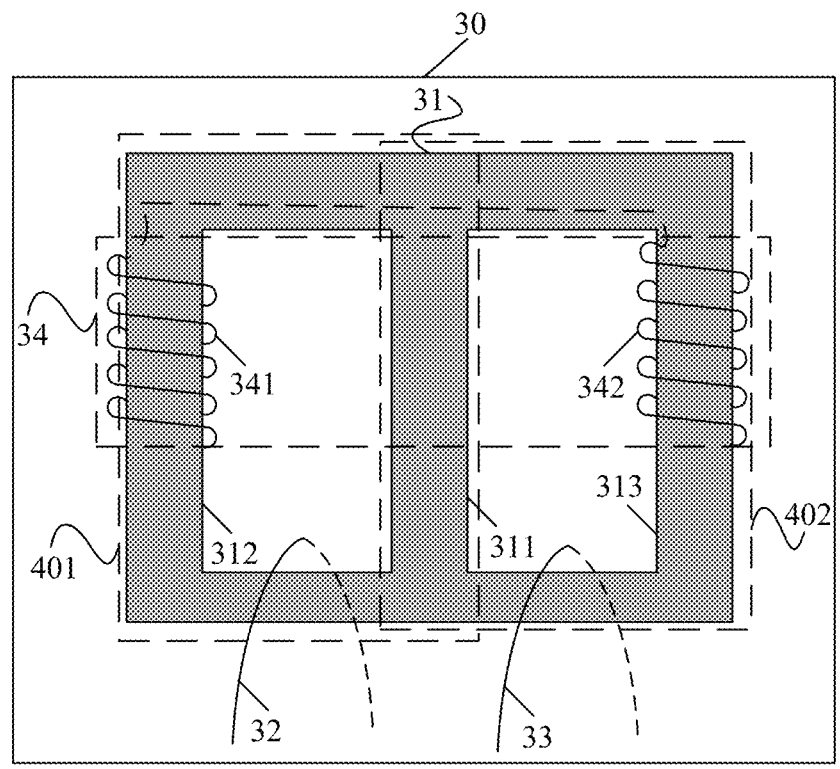
FIG. 7 is a schematic structural diagram of another current transformer according to an embodiment of this application.

FIG. 7 is a schematic structural diagram of another current transformer according to an embodiment of this application. As shown in the diagram, a current transformer 30 includes a magnetic core 31, a first primary-side winding 32, a second primary-side winding 33, and a second secondary-side winding 34.

The magnetic core 31 includes a first closed magnetic circuit 401 and a second closed magnetic circuit 402. A first magnetic core structure 311 and a second magnetic core structure 312 are connected to constitute the first closed magnetic circuit 401, and the first magnetic core structure 311 and a third magnetic core structure 313 are connected to constitute the second closed magnetic circuit 402. The first magnetic core structure 311 is a magnetic core structure common to the first closed magnetic circuit 401 and the second closed magnetic circuit 402. The first primary-side winding 32 passes through the first closed magnetic circuit 401, and the second primary-side winding 33 passes through the second closed magnetic circuit 402. A first winding 341 of the second secondary-side winding 34 is wound around the second magnetic core structure 312, a second winding 342 of the second secondary-side winding 34 is wound around the third magnetic core structure 313, and the first winding 341 and the second winding 342 are serially connected.

As shown in FIG. 5, the direction of the electrified current i1 that flows through the first primary-side winding and the direction of the electrified current i2 that flows through the second primary-side winding are both perpendicular to paper outward. The i1 generates the first magnetic field, and the i2 generates the second magnetic field. When the magnetic field passes through a cross section of the second magnetic core structure, the magnetic field direction of the first magnetic field is downward, and a positive direction of a third magnetic flux Φ31 generated by the i1 in the second magnetic core structure is downward; and a magnetic field direction of the second magnetic field is downward, and a fourth magnetic flux Φ41 generated by the i2 in the second magnetic core structure is downward. When the magnetic field passes through a cross section of the third magnetic core structure, the magnetic field direction of the first magnetic field is upward, and a positive direction of a third magnetic flux Φ32 generated by the i1 in the third magnetic core structure is upward; and the magnetic field direction of the second magnetic field is upward, and a positive direction of a fourth magnetic flux Φ42 generated by the i2 in the second magnetic core structure is upward.

As shown in FIG. 6, the direction of the electrified current i1 that flows through the first primary-side winding is perpendicular to paper inward, and the direction of the electrified current i2 that flows through the second primary-side winding is perpendicular to paper outward. The i1 generates the first magnetic field, and the i2 generates the second magnetic field. When the magnetic field passes through a cross section of the second magnetic core structure, the magnetic field direction of the first magnetic field is upward, and a positive direction of a fourth magnetic flux Φ41 generated by the i2 in the second magnetic core structure is downward. When the magnetic field passes through a cross section of the third magnetic core structure, the magnetic field direction of the first magnetic field is downward, and a positive direction of a third magnetic flux Φ32 generated by the i1 in the third magnetic core structure is downward; and the magnetic field direction of the second magnetic field is upward, and a positive direction of a fourth magnetic flux Φ42 generated by the i2 in the second magnetic core structure is upward.

It can be learned from FIG. 5 and FIG. 6 that when the electrified current that flows through the first primary-side winding and the electrified current that flows through the second primary-side winding are currents with a same direction, magnetic fluxes generated by the two electrified currents in the second magnetic core structure have a same direction: a positive direction or a negative direction; magnetic fluxes generated in the third magnetic core structure also have a same direction: a positive direction or a negative direction; and the magnetic fluxes are superimposed in the second magnetic core structure and the magnetic fluxes are superimposed in the third magnetic core structure. When the electrified current that flows through the first primary-side winding and the electrified current that flows through the second primary-side winding are currents with different directions, magnetic fluxes generated by the two electrified currents in the second magnetic core structure have different directions: a positive direction and a negative direction; magnetic fluxes generated in the third magnetic core structure have different directions: a positive direction and a negative direction; and the magnetic fluxes cancel each other out in the second magnetic core structure and the magnetic fluxes cancel each other out in the third magnetic core structure.

Because the differential mode currents have opposite directions and a same value, and the common mode currents have a same direction. Magnetic fluxes generated by the differential mode currents in the second magnetic core structure cancel each other out, and magnetic fluxes generated by the common mode currents in the second magnetic core structure are superimposed. The magnetic fluxes in the second magnetic core structure are magnetic fluxes generated by the common mode currents passing through the first primary-side winding and the second primary-side winding. An induced current generated by the first winding of the second secondary-side winding wound around the second magnetic core structure is an induced current corresponding to the common mode currents. Magnetic fluxes generated by the differential mode currents in the third magnetic core structure cancel each other out, and magnetic fluxes generated by the common mode currents in the third magnetic core structure are superimposed. The magnetic fluxes in the third magnetic core structure are mainly magnetic fluxes generated by the common mode currents passing through the first primary-side winding and the second primary-side winding. An induced current generated by the second winding of the second secondary-side winding in the third magnetic core structure is an induced current corresponding to the common mode currents. The first winding and the second winding are serially connected, and a current detected by the second secondary-side winding is a common mode current, so that the common mode current can be independently measured.

In some possible embodiments, further, with reference to the two solutions of the current transformers in FIG. 4 and FIG. 7, one current transformer may be configured to detect both the differential mode current and the common mode current.

Figure 8:
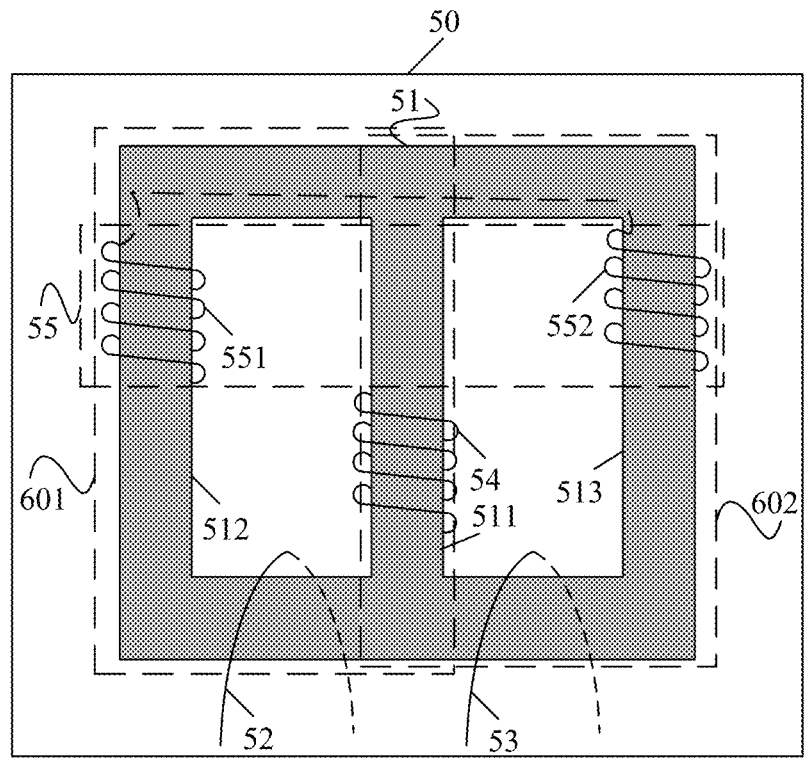
FIG. 8 is a schematic structural diagram of still another current transformer according to an embodiment of this application.

FIG. 8 is a schematic structural diagram of still another current transformer according to an embodiment of this application. As shown in the diagram, a current transformer 50 includes a magnetic core 51, a first primary-side winding 52, a second primary-side winding 53, a first secondary-side winding 54, and a second secondary-side winding 55.

The magnetic core 51 includes a first closed magnetic circuit 601 and a second closed magnetic circuit 602. The first closed magnetic circuit 601 is formed by connecting a first magnetic core structure 511 and a second magnetic core structure 512, the second closed magnetic circuit 602 is formed by connecting the first magnetic core structure 511 and a third magnetic core structure 513, and the first magnetic core structure 511 is a magnetic core structure common to the first closed magnetic circuit 601 and the second closed magnetic circuit 602. The first primary-side winding 52 passes through the first closed magnetic circuit 601, and the second primary-side winding 53 passes through the second closed magnetic circuit 602. The first secondary-side winding is wound around the first magnetic core structure 511. A first winding 551 of the second secondary-side winding 55 is wound around the second magnetic core structure 512, a second winding 552 of the second secondary-side winding 55 is wound around the third magnetic core structure 513, and the first winding 551 and the second winding 552 are serially connected.

In one embodiment, the foregoing describes the positive direction and the negative direction of the magnetic fluxes generated by the electrified currents that flow through the first primary-side winding and the second primary-side winding in the first magnetic core structure, the second magnetic core structure, and the third magnetic core structure. Details are not described herein again. It can be learned from the foregoing content that the current detected by the first secondary-side winding is the differential mode current, so that the differential mode current can be independently measured; and the current detected by the second secondary-side winding is the common mode current, so that the common mode current can be independently measured. That is, the current transformer in this embodiment of this application can independently measure both the common mode current and the differential mode current.

The foregoing describes structures of several current transformers in this application. The following describes some possible structures and features of a magnetic core of the current transformer.

In this application, the first primary-side winding, the second primary-side winding, the first secondary-side winding, and/or the second secondary-side winding are/is insulated from each other. The first primary-side winding, the second primary-side winding, the first secondary-side winding, and/or the second secondary-side winding are/is constituted by a conductive coil and an insulation layer that is surrounded by the coil. The first secondary-side winding and/or the second secondary-side winding respectively have more coil turns than the first primary-side winding and the second primary-side winding. For example, the first primary-side winding and the second primary-side winding each have one turn, and the first secondary-side winding and/or the second secondary-side winding each have five turns. In a specific implementation, a quantity of turns and a turn ratio of the first primary-side winding, the second primary-side winding, the first secondary-side winding, and/or the second secondary-side winding may be designed depending on a specific requirement. This is not limited in this application.

In one embodiment, the first magnetic core structure, the second magnetic core structure, and the third magnetic core structure are made of a soft magnetic material for magnetic line transmission in a magnetic circuit. The soft magnetic material includes but is not limited to a soft iron, a soft magnetic alloy, a ferrite material, and a silicon steel sheet. To ensure that the first magnetic core structure, the second magnetic core structure, and the third magnetic core structure have a same magnetic permeability, the first magnetic core structure, the second magnetic core structure, and the third magnetic core structure may have a same soft magnetic material.

In a possible implementation, the second magnetic core structure and the third magnetic core structure may be magnetic core structures that have some same features. For example, the second magnetic core structure and the third magnetic core structure have a same size and a same shape, or the second magnetic core structure and the third magnetic core structure have a same magnetic resistance, or a magnetic permeability of the second magnetic core structure is the same as a third magnetic permeability.

In another embodiment, the second magnetic core structure and the third magnetic core structure may be two completely same magnetic core structures. Herein, that the second magnetic core structure is completely the same as the third magnetic core structure means that the size, the shape, the magnetic resistance, the magnetic permeability, and the like of the second magnetic core structure are the same as those of the third magnetic core structure.

In some possible embodiments, the second magnetic core structure may be a "U"-shaped magnetic core structure, an arc-shaped magnetic core structure, an angle-shaped magnetic core structure, or the like. The third magnetic core structure may be a "U"-shaped magnetic core structure, an arc-shaped magnetic core structure, an angle-shaped magnetic core structure, or the like. A shape and a size of the second magnetic core structure and a shape and a size of the third magnetic core structure are not limited in this application.

Figure 9:
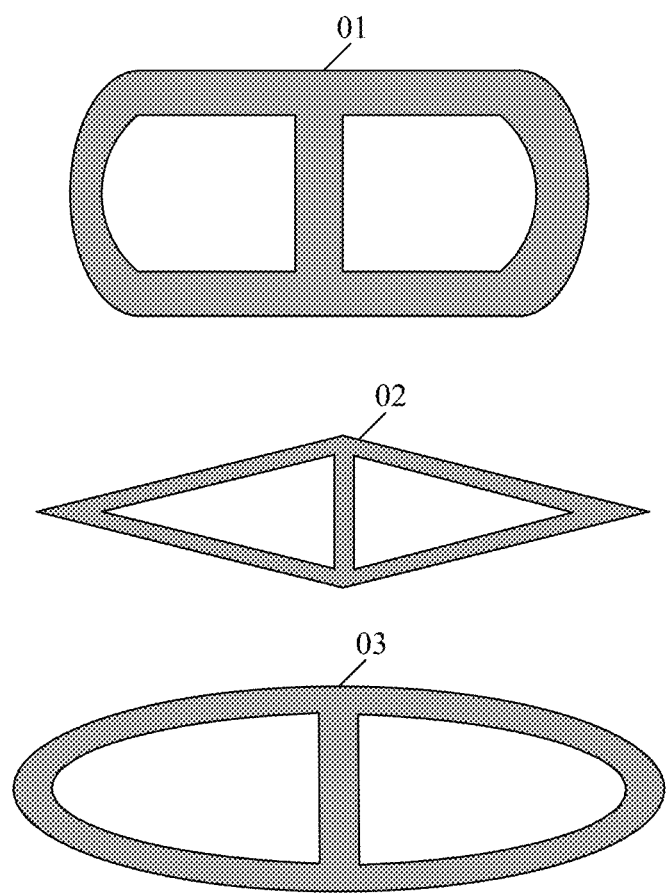
FIG. 9 is schematic diagrams of several shapes of a magnetic core of a current transformer according to an embodiment of this application.

When the second magnetic core structure is the same as the third magnetic core structure, the magnetic core of the current transformer may be shown in FIG. 9. Both a second magnetic core structure and a third magnetic core structure of a magnetic core 01 are "U"-shaped magnetic core structures. A second magnetic core structure and a third magnetic core structure of a magnetic core 02 are angle-shaped magnetic core structures, and both a second magnetic core structure and a third magnetic core structure of a magnetic core 03 are arc-shaped magnetic core structures.

It should be noted that, on the premise that a process condition is met, a magnetic resistance of a first closed magnetic circuit and a magnetic resistance of a second closed magnetic circuit are reduced as much as possible, to increase a common-mode/differential-mode suppression capability of a current transformer. In an optional implementation, a magnetic resistance of the first magnetic core structure may be reduced, so as to reduce the magnetic resistance of the first closed magnetic circuit and the magnetic resistance of the second closed magnetic circuit; or a magnetic resistance of the second magnetic core structure and a magnetic resistance of the third magnetic core structure may be reduced, so as to reduce the magnetic resistance of the first closed magnetic circuit and the magnetic resistance of the second closed magnetic circuit.

In the embodiments of this application, when the current transformer is configured to detect the differential mode current, the current transformer may cancel the magnetic flux generated by the common mode current out, eliminate interference of the common mode current, and accurately collect a differential-mode-current signal. When the current transformer is configured to detect the common mode current, the current transformer may cancel the magnetic flux generated by the differential mode current out, eliminate interference of the differential mode current, and accurately collect a differential-mode-current signal. The current transformer in this application may independently measure the differential mode current and the common mode current.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A current transformer, comprising:
a magnetic core having a first magnetic core structure, a second magnetic core structure, and a third magnetic core structure, wherein the first magnetic core structure is connected to the second magnetic core structure to form a first closed magnetic circuit, the first magnetic core structure is connected to the third magnetic core structure to form a second closed magnetic circuit, and the first magnetic core structure is a magnetic core structure common to the first closed magnetic circuit and the second closed magnetic circuit;
a first primary-side winding;
a second primary-side winding;
a first secondary-side winding; and
a second secondary-side winding, wherein
the first closed magnetic circuit passes through the first primary-side winding, and the second closed magnetic circuit passes through the second primary-side winding; and
the first secondary-side winding is wound around the first magnetic core structure, wherein the first secondary-side winding outputs a differential mode currents signal for a first current passing through the first primary-side winding and a second current passing through the second primary-side winding of the current transformer; and
wherein the current transformer is configurable with a first winding and a second winding of the second secondary-side winding connected directly to one another, wherein the second secondary-side winding outputs a common mode currents signal for the first current passing through the first primary-side winding and the second current passing through the second primary-side winding of the current transformer so that the current transformer is configurable to independently output both the common mode currents signal and the differential mode currents signal.

2. The current transformer according to claim 1, wherein a current that is to be detected by the current transformer separately flows through the first primary-side winding and the second primary-side winding, and the first secondary-side winding outputs a detection signal of the current transformer.

3. The current transformer according to claim 1, wherein the second magnetic core structure is an arc-shaped magnetic core structure.

4. The current transformer according to claim 1, wherein the second magnetic core structure and the third magnetic core structure have a same size and a same shape.

5. The current transformer according to claim 1, wherein the second magnetic core structure and the third magnetic core structure have a same magnetic resistance.

6. The current transformer according to claim 1, wherein the first primary-side winding is wound around a joint between the first magnetic core structure and the second magnetic core structure, and the second primary-side winding is wound around a joint between the first magnetic core structure and the third magnetic core structure.

7. A current transformer, comprising:
a magnetic core having a first magnetic core structure, a second magnetic core structure, and a third magnetic core structure, wherein the first magnetic core structure is connected to the second magnetic core structure to form a first closed magnetic circuit, the first magnetic core structure is connected to the third magnetic core structure to form a second closed magnetic circuit, and the first magnetic core structure is a magnetic core structure common to the first closed magnetic circuit and the second closed magnetic circuit;
a first primary-side winding;
a second primary-side winding; and
a second secondary-side winding, wherein
the first closed magnetic circuit passes through the first primary-side winding, and the second closed magnetic circuit passes through the second primary-side winding; and
a first winding of the second secondary-side winding is wound around the second magnetic core structure, a second winding of the second secondary-side winding is wound around the third magnetic core structure, and the first winding and the second winding of the second secondary-side winding are serially connected directly to one another, wherein the second secondary-side winding outputs a common mode currents signal for a first current passing through the first primary-side winding and a second current passing through the second primary-side winding of the current transformer.

8. The current transformer according to claim 7, wherein a current that is to be detected by the current transformer separately flows through the first primary-side winding and the second primary-side winding, and the second secondary-side winding outputs a detection signal of the current transformer.

9. The current transformer according to claim 7, wherein the second magnetic core structure is an angle-shaped magnetic core structure.

10. The current transformer according to claim 7, wherein the second magnetic core structure and the third magnetic core structure have a same size and a same shape.

11. The current transformer according to claim 7, wherein the second magnetic core structure and the third magnetic core structure have a same magnetic resistance.

12. The current transformer according to claim 7, wherein the first primary-side winding is wound around a joint between the first magnetic core structure and the second magnetic core structure, and the second primary-side winding is wound around a joint between the first magnetic core structure and the third magnetic core structure.

* * * * *